United States Patent [19]

Jennings

[11] Patent Number: 4,672,403
[45] Date of Patent: Jun. 9, 1987

[54] LATERAL SUBSURFACE ZENER DIODE
[75] Inventor: Dean C. Jennings, Sunnyvale, Calif.
[73] Assignee: National Semiconductor Corporation, Santa Clara, Calif.
[21] Appl. No.: 778,944
[22] Filed: Sep. 23, 1985
[51] Int. Cl.[4] .................... H01L 29/90; H01L 29/06
[52] U.S. Cl. ........................................ 357/13; 357/20; 357/63; 357/88; 357/91
[58] Field of Search ..................... 357/13, 20, 63, 88, 357/91

[56] References Cited

U.S. PATENT DOCUMENTS

| | | | |
|---|---|---|---|
| 3,881,179 | 4/1975 | Howard, Jr. | 357/13 |
| 4,079,402 | 3/1978 | Dunkley et al. | 357/13 |
| 4,119,440 | 10/1978 | Hill | 357/13 |
| 4,136,349 | 1/1979 | Tsang | 357/13 |
| 4,484,206 | 11/1984 | Moroshima et al. | 357/13 |

Primary Examiner—J. Carroll
Attorney, Agent, or Firm—Gail W. Woodward

[57] ABSTRACT

A subsurface zener diode is formed in an N type semiconductor substrate such as the kind employed in the epitaxial layer found in silicon monolithic PN junction isolated integrated circuits. A P+ anode is ion implanted into and diffused from an oxide source and an N++ cathode is diffused within the confines of the anode. The cathode is surrounded with a counter-doped region that forces the PN junction breakdown subsurface. The resulting diode has a clean, sharp breakdown curve and the breakdown voltage can be tailored by controlling the anode deposition.

3 Claims, 3 Drawing Figures

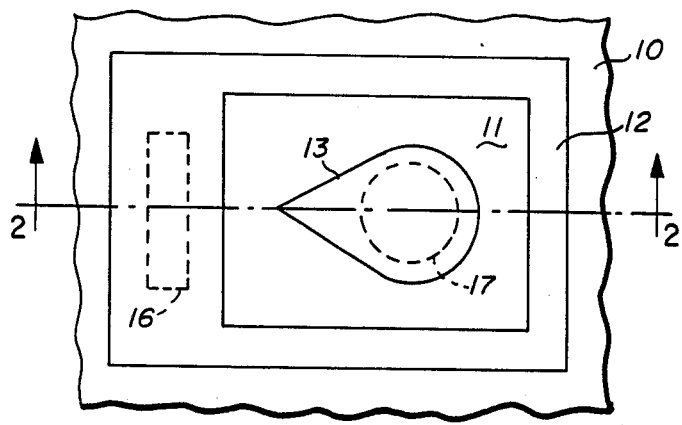
Fig_1
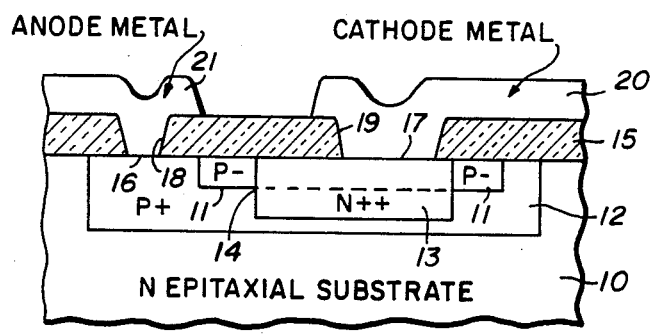
Fig_2
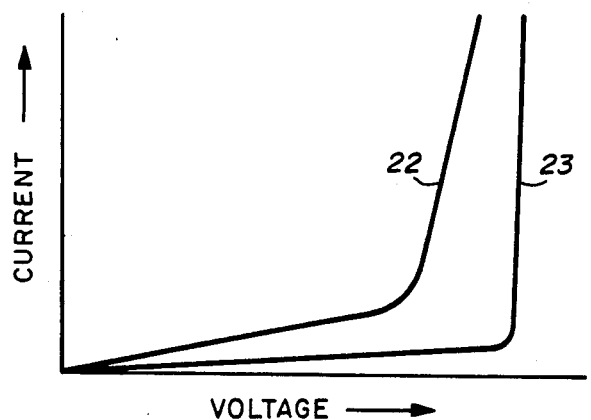
Fig_3

LATERAL SUBSURFACE ZENER DIODE

BACKGROUND OF THE INVENTION

The invention relates to silicon monolithic PN junction isolated integrated circuit (IC) devices. Specifically, the invention relates to the zener diodes fabricated into such IC structures. In order to avoid the unpredictable effects of the silicon surface the diode breakdown is confined to a subsurface region. This acts to reduce diode leakage and noise and increase stability. The advantages of subsurface diode operation is set forth in a publication by Robert C. Dobkin in the Sept. 16, 1976, issue of ELECTRONICS on pages 106-112. The diodes described were employed in the well-known LM199 series devices available from National Semiconductor Corporation and others.

U.S. Pat. No. 4,127,859 issued to Carl T. Nelson on Nov. 28, 1978, and is assigned to the assignee of the present invention. Here a subsurface diode is created between a P++ IC isolation diffusion and an N++ diffusion of the kind employed in the fabrication of NPN transistor emitters. An N+ buried layer must be located at the substrate to epitaxial layer interface to limit the penetration of the isolation diffusion into the silicon substrate. The zener breakdown is confined to the central portion of the underside of the N++ diffusion. This structure suffers from the disadvantage that the zener action occurs in a very heavily doped silicon region and the crystal structure in this region is not of high quality. Furthermore, the structure involves substantial surface area and therefore cannot be made very small.

U.S. Pat. No. 4,079,402 to James L. Dunkley and James E. Solomon, issued Mar. 14, 1978, and is also assigned to the assignee of the present invention. Here a thin ion implanted region produces a subsurface zener diode action. The process is employed in those IC devices that typically employ ion implanted JFET devices. These devices are employed in the LF155 series IC's available from National Semiconductor Corporation and others.

The teaching in the above-referenced publication and the two patents is incorporated herein by reference.

SUMMARY OF THE INVENTION

It is an object of the invention to provide a zener diode having a controlled subsurface breakdown region.

It is a further object of the invention to control the semiconductor doping in the subsurface breakdown region of a zener diode and to confine the action to a high quality crystal region of the semiconductor.

It is a still further object of the invention to provide a fabrication process for making a zener diode that has a subsurface breakdown region and a controlled breakdown characteristic.

These and other objects are achieved as follows. First, a surface counter doping region is established in the diode anode using ion implantation in a region that will ultimately surround the diode cathode. Then, the diode anode is deposited and diffused into the semiconductor surface. In this step, an oxide layer is employed as the diffusion source and the anode impurity is implanted in this oxide layer so that minimal semiconductor crystal damage is created in the anode fabrication. At this point, other regions of the die are opened, an oxide layer grown (as a diffusion source), and implanted with an impurity for the transistor bases in the IC. Then these impurities are diffused forming the zener anode and transistor bases in the IC. Then, the surface of the silicon is stripped of oxide and a uniform thermal oxide is grown. Then the NPN transistor emitters and the zener diode cathodes are diffused into the silicon using the oxide as a mask. After the emitter diffusion a layer of oxide is vapor deposited over the semiconductor so as to cover the emitters and zener diode cathodes. At this point, the silicon is gettered in an atmosphere containing oxygen and phosphorus so that the exposed oxide surface is converted to a phosphosilicate glass (PSG). A post getter etch then removes the contaminated glass surface. Then, using a contact mask, the silicon is photolithographically etched to expose the silicon surface where contacts are to be applied. A layer of metallization applied and subsequently contoured to create the device interconnections.

The resulting zener diode has its breakdown action buried beneath the original counter doping region. This permits control over the depths at which breakdown occurs. The cathode can be shaped so that the initial breakdown is concentrated in a high voltage stress region so that a clean reliable breakdown is achieved. The anode is of controlled conductivity so that the breakdown voltage can be established and controlled. The shape of the cathode makes a relatively large diode area available which reduces the current density in the anode and keeps the diode series resistance low. The result is a controlled breakdown voltage zener diode having a clean and reliable noise-free breakdown characteristic.

BRIEF DESCRIPTION OF THE DRAWING

FIG. 1 is a topographical showing of a zener diode.

FIG. 2 is a cross-section of the diode of FIG. 1 taken at line 2—2.

FIG. 3 is a graph showing the typical prior art and the improved diode performance.

DESCRIPTION OF THE INVENTION

The diode to be described is intended for use in a monolithic silicon PN junction isolated IC. The various process steps are to be integrated into the standard IC fabrication process. However, if desired, the zener diode could be fabricated in large numbers in a silicon wafer and then packaged individually in conventional discrete diode packages.

FIG. 1 shows the topography of a single zener diode. While not shown the diode could be surrounded by an isolation diffusion that penetrates the IC epitaxial layer and electrically isolates a tub of epitaxial material. In the conventional IC the substrate 10 is of N type conductivity. In FIG. 1, the conventional passivating oxide and the metallization have been omitted for clarity. Accordingly, the contact areas 16 and 17 are shown in dashed outline. FIG. 2, which is a cross-section of the diode, is not to scale. The vertical dimensions have been exaggerated for clarity. The metallization is shown in FIG. 2 to indicate the device connections.

The diode is made up of a diffused P+ anode 12 and a diffused N++ cathode 13. A counter-doped P− region 11 ensures that the diode breakdown region, indicated at 14, is below the silicon surface.

The fabrication process will now be described in terms of obtaining the preferred embodiment. The starting material is the N type silicon epitaxial layer normally found in a conventional PN junction isolated monolithic IC. Fragment 10 represents that portion of an IC wafer in which the zener diode is to be located.

It will be assumed that the isolation diffusion (not shown) has been accomplished and the wafer is covered by a thermally grown post diffusion oxide at least 5000 Å thick. A mask is used to photolithographically remove the oxide above region 11 where the counter doping is to be applied. Antimony is then ion implanted to a level of about $2 \times 10^{15}$ atoms per cm$^2$ at an energy of about 100 keV. The antimony, which is a slow diffuser in silicon, is then diffused for about 90 minutes at about 1200° C. This results in a surface doping level of about $6 \times 10^{18}$ atoms per cm$^3$. This antimony will act to counter dope the anode which will be applied in a subsequent step. Since antimony is a slow diffuser and its diffusion is accomplished at the highest wafer processing temperature, the penetration of region 11 is initially set and the subsequent diffusions will not greatly affect it. The antimony does not dominate, but acts to compensate some of the boron and therefore raise the resistivity. Where region 11 crosses the subsequently applied region 13, as shown by the dashed line, it will add to the doping so the cathode will be relatively unaffected by region 11 doping.

At this point, the masking oxide is stripped from the wafer using an HF acid bath and a high quality oxide grown by exposing the wafer to a steam atmosphere at about 1150° C. for about 75 minutes. This grows an oxide about 8100 Å thick. Then a mask is employed to photolithographically remove the oxide in region 12 and an oxide about 1700 Å thick grown on the exposed silicon. This oxide will be doped so as to make it a diffusion source. To do this boron is implanted at a dose of about $10^{16}$ atoms per cm$^2$ at an energy of 70 keV. At this energy most of the boron atoms will be trapped in the oxide while a portion of them will pass completely through the oxide and enter the silicon surface. At this stage of processing the NPN transistor bases are photolithographically defined in the oxide and a 1700 Å oxide grown therein. During this base oxide growth step the oxide in the zener diode anode region 12 will have increased to about 2400 Å. Then boron is ion implanted at a dose of about $5.4 \times 10^{14}$ atoms per cm$^2$ at an energy of about 70 keV. This transistor base dose adds to the previous dose of boron in the oxide in the region of the zener diode anode. The boron is then diffused at about 1150° C. for about 90 minutes. This creates the transistor bases and the zener diode anode 12.

The oxides are then stripped from the wafer by immersion for about 5 minutes in a 49% HF acid solution. This is followed by a deposited oxide using conventional plasma assisted chemical vapor deposition to produce an oxide about 6500Å thick. The next step is accomplished during NPN transistor emitter diffusion. The emitters and zener diode cathodes (region 13) are photolithographically etched so as to expose the silicon surface. Then the wafer is exposed to a POCl$_3$ atmosphere at about 1070° C. for about 20 minutes followed by a nitrogen atmosphere for about 15 minutes. This produces a heavily doped or N++ region and leaves an oxide layer over the doped region. Then a 6500 Å layer of oxide is vapor deposited over the emitters and zener diode cathodes previously diffused. This produces the final oxide layer 15.

Then the wafer is then subjected to a gettering step which involves exposing it to a POCl$_3$ atmosphere at about 1000° C. for about 20 minutes followed by a nitrogen purge for about 2 minutes. This converts the oxide surface to PSG which acts as a getter for mobile impurities. A subsequent dip in a 10:1 HF acid bath removes the gettered impurities along with a portion of the oxide surface. At this point the oxide over the emitters and zener diode cathode is about 4800 Å thick.

The wafer is then annealed for about 20 minutes at about 900° C. in nitrogen. The contact mask is then applied to the wafer for photolithographic removal of the oxide where contacts are desired. At this point, holes 18 and 19 are present in oxide 15. Then a layer of aluminum about 1.65 microns thick is deposited on the wafer and photolithographically etched to produce the desired IC interconnection pattern. At this point contacts 20 and 21 are present at the zener diode cathode 13 and anode 12 respectively.

In FIG. 2 it can be seen that the zener diode breakdown will occur just under the counter-doped region 11. This will represent the highest doping levels in the PN junction that exists between regions 12 and 13. Clearly, this breakdown will be located below the silicon surface by the thickness of region 11. It will be noted that cathode region 13 is provided with a sharp point having a small radius of curvature at its left-hand extreme. This point will act to concentrate the electric stress and define that point at which the PN junction will first break down. This gives the zener diode a well defined break in its voltage-current curve.

FIG. 3 is a graph of the diode current response to applied reverse voltage. Curve 22 represents the sort of response found in the prior art zener diodes. The zener voltage for the Nelson diode structure is about 5.6 volts. Curve 23 represents the response obtained using the invention. It can be seen that the knee is sharper and this is due primarily to the location of region 14. The reverse current below breakdown is lower because of better silicon crystal perfection. The curve is flatter due to the high conductivity of regions 12 and 13. The actual value of the zener voltage is primarily dependent upon the doping level in region 12 which is determined in the boron ion implants. This value can be tailored to suit the diode application. Using the above-described processing values the zener voltage was found to be close to 6 volts. Values between 5.7 and about 10 volts could be obtained by varying the boron ion implant dose.

The invention has been described in terms of the preferred embodiment. When a person skilled in the art reads the foregoing description, alternatives and equivalents, within the spirit and intent of the invention, will be apparent. Accordingly, it is intended that the scope of the invention be limited only by the following claims.

I claim:

1. A zener diode comprising:
    an anode comprising a P region extending into an N type substrate and forming a PN junction therewith that extends to a surface of said substrate;
    a cathode comprising an N region extending part way through said anode and forming a PN junction therewith that extends to said surface of said substrate;
    a counter-doped region surrounding said cathode and extending from said surface into said anode to a lesser extent than said cathode, said counter-doped region containing N type impurities in a concentration that will raise the resistivity of said anode but will be insufficient to convert said anode region to N type conductivity, whereby the PN junction that exists between said anode and said cathode has a breakdown region that lies just under said counter-doped region so that said breakdown region is located below said surface; and means for making electrical contact to said anode and said cathode.

2. A zener diode of claim 1 wherein the topography of said cathode includes a portion having a small radius of curvature whereby said breakdown is localized and initiated.

3. The zener diode of claim 1 wherein said breakdown occurs at a voltage determined primarily by the doping level of said anode.

* * * * *